(12) United States Patent
Lee et al.

(10) Patent No.: US 7,918,704 B2
(45) Date of Patent: Apr. 5, 2011

(54) ORGANIC ELECTROLUMINESCENT DISPLAY PANEL AND METHOD FOR FABRICATING SAME

(75) Inventors: Shi-Hao Lee, Panchiao (TW); Ming-Chang Shih, Chang Hua Hsien (TW)

(73) Assignee: Au Optronics Corp, Hsinchu (TW)

( * ) Notice: Subject to any disclaimer, the term of this patent is extended or adjusted under 35 U.S.C. 154(b) by 779 days.

(21) Appl. No.: 11/438,357

(22) Filed: May 23, 2006

(65) Prior Publication Data

US 2007/0035225 A1 Feb. 15, 2007

(30) Foreign Application Priority Data

Aug. 12, 2005 (TW) ................ 94127642 A (51) Int. Cl.
*H01J 9/24* (2006.01)
(52) U.S. Cl. ............. 445/24; 313/504; 313/506
(58) Field of Classification Search .......... 313/498–512; 445/24
See application file for complete search history.

(56) References Cited

U.S. PATENT DOCUMENTS

| | | | | |
|---|---|---|---|---|
| 4,634,928 A | * | 1/1987 | Figueroa et al. | 313/499 |
| 5,724,107 A | * | 3/1998 | Nishikawa et al. | 349/38 |
| 6,758,538 B2 | * | 7/2004 | Fujita et al. | 313/506 |
| 2002/0047509 A1 | * | 4/2002 | Araki et al. | 313/479 |
| 2002/0167268 A1 | * | 11/2002 | Aruga et al. | 313/500 |
| 2004/0051950 A1 | * | 3/2004 | Noguchi | 359/603 |
| 2004/0082095 A1 | * | 4/2004 | Moriyama et al. | 438/69 |
| 2004/0113549 A1 | * | 6/2004 | Roberts et al. | 313/512 |
| 2004/0160165 A1 | * | 8/2004 | Yamauchi | 313/498 |
| 2005/0023971 A1 | | 2/2005 | Furugori et al. | |

FOREIGN PATENT DOCUMENTS

| | | |
|---|---|---|
| CN | 1535096 A | 10/2004 |
| CN | 1571605 A | 1/2005 |
| JP | 2005-085739 A | 3/2005 |
| TW | 231382 B | 4/2005 |
| TW | 234125 B | 6/2005 |

* cited by examiner

*Primary Examiner* — Bumsuk Won
(74) *Attorney, Agent, or Firm* — Birch, Stewart, Kolasch & Birch, LLP (57) ABSTRACT

An organic electroluminescent display panel comprises a substrate, an anti-reflective layer, a light-shielding layer, a transistor and an organic light emitting diode. A method for fabricating said organic electroluminescent display panel comprises forming the anti-reflective layer on the substrate; forming the light-shielding layer with a first region and a second region on the anti-reflective layer; and then, removing at least part of the light-shielding layer to expose at least part of anti-reflective layer in the first region. After that, the transistor is formed above the light-shielding layer in the second region, and the organic light emitting diode is formed above the anti-reflective layer in the first region.

9 Claims, 8 Drawing Sheets

ORGANIC ELECTROLUMINESCENT DISPLAY PANEL AND METHOD FOR FABRICATING SAME

This application claims the benefit of Taiwan Patent Application Serial No. 094127642, filed Aug. 12, 2005, the subject matter of which is incorporated herein by reference.

BACKGROUND OF THE INVENTION (1) Field of the Invention

The present invention relates to an organic electroluminescent display panel with an anti-reflective layer and its fabricating method.

(2) Description of the Related Art

Contrast ratio (CR) is an important index for the consumers to pick out and buy the display. It is defined as the brightness ratio of the lightest state to the darkest state at the same point on the display. High contrast ratio means that relatively high brightness and bright colors. Accordingly, a higher contrast ratio means that better image quality of the display. Under the circumstance, black is blacker, and white is whiter, the display can appear more colors.

The organic electroluminescent display panel is self-luminous, so it has the minimum brightness when no light emitted from it. According to the definition, if the contrast ratio is measured in a darkroom, it tends to infinity because the minimum brightness tends to zero. It makes the contrast ratio lose its significance. Therefore, the contrast ratio of the organic electroluminescent display panel should be measured in a lightroom. The way is to provide an environmental light for the organic electroluminescent display panel to measure the brightness of the light reflected by the organic electroluminescent display panel which does not emit light. Industry standards currently allow for 500 lux maintained for the lightroom.

One way of obtaining the better contrast ratio is to reduce the environmental brightness. Usually, the organic electroluminescent display panel uses the black matrix to reduce the reflection in order to increase the contrast ratio.

Figure 1A:
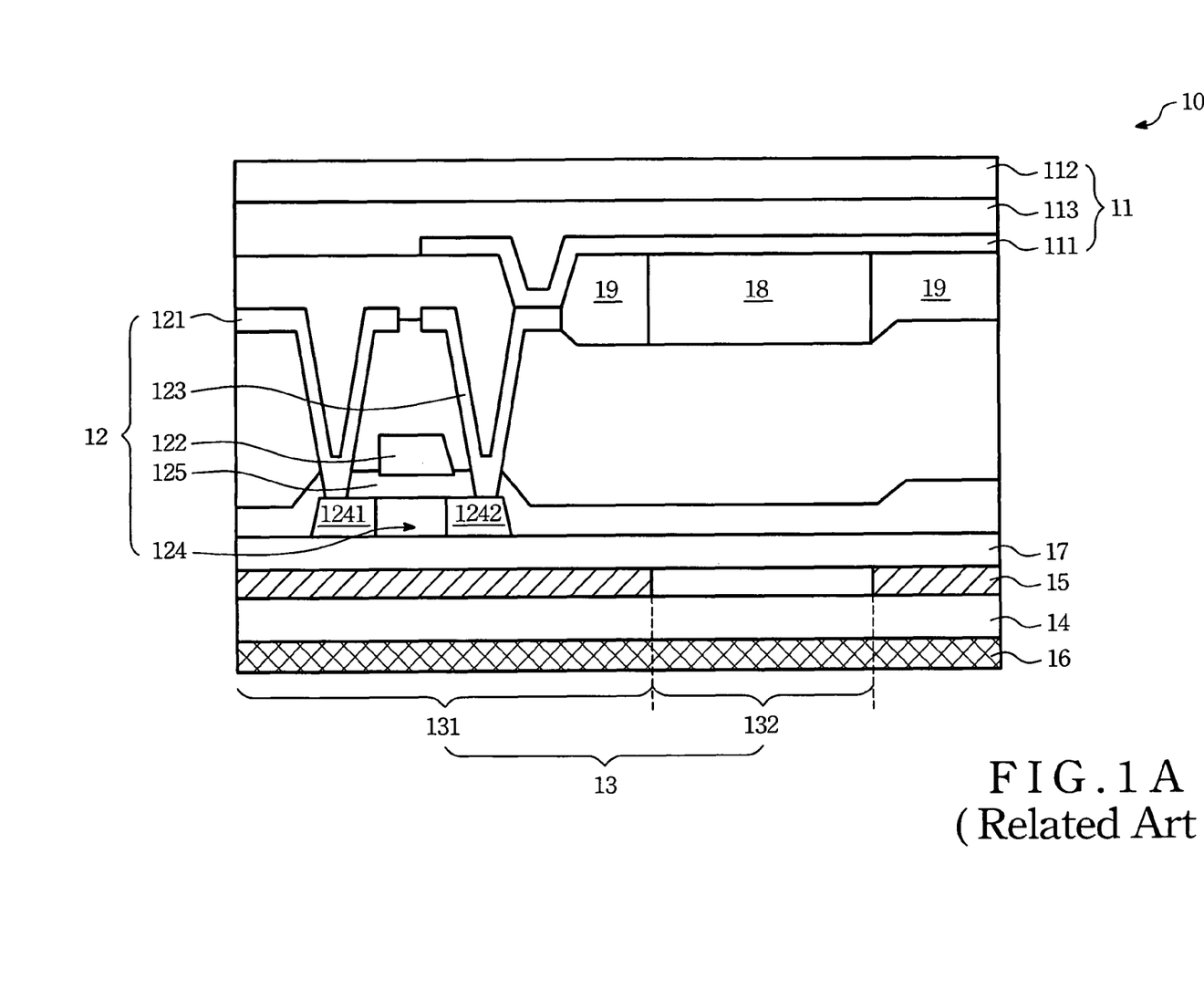
FIG. 1A is an organic electroluminescent display panel according to the related art.

Refer to FIG. 1A, the conventional organic electroluminescent display panel 10 includes an organic light emitting diode 11 and its driving transistor 12, which are placed in an active area 13. The organic light emitting diode 11 has a bottom electrode 111, a top electrode 112 and an organic emissive layer 113 sandwiched between the two electrode 111, 112. The driving transistor 12 includes a source metal 121, a gate metal 122, a drain metal 123 and a channel 124. The channel 124 is isolated from the gate metal 122 by an inner layer dielectric 125. The channel 124 has a source contacting area 1241 and a drain contacting area 1242 to respectively contact with the source metal 121 and the drain metal 123. The drain metal 123 is electrically connected the bottom electrode 111 of the organic light emitting diode 11.

A part of the active region 13 is covered by a black matrix pattern to form a black matrix region 131, the other part is not covered to form an opening region 132. As shown, a patterning black matrix 15 is formed on the substrate 14 in the black matrix region 131. The driving transistor 12 is disposed on the black matrix 15. Between the driving transistor 12 and the black matrix 15 has a buffer layer 17, such as silicon oxide. The opening region 132 is below the organic light emitting diode 11 to allow the light to exit, and is covered by a color filter layer 18 to define the light color. The edge of the color filter layer 18 has a black photoresist 19 corresponding to the black matrix 15.

It is note that, there is no anti-reflective structure formed between the substrate 14 and the organic light emitting diode 11 in the opening region 132, so that the reflectivity of the whole display panel is lager than 20% not to rise the contrast ratio efficiently.

Figure 1B:
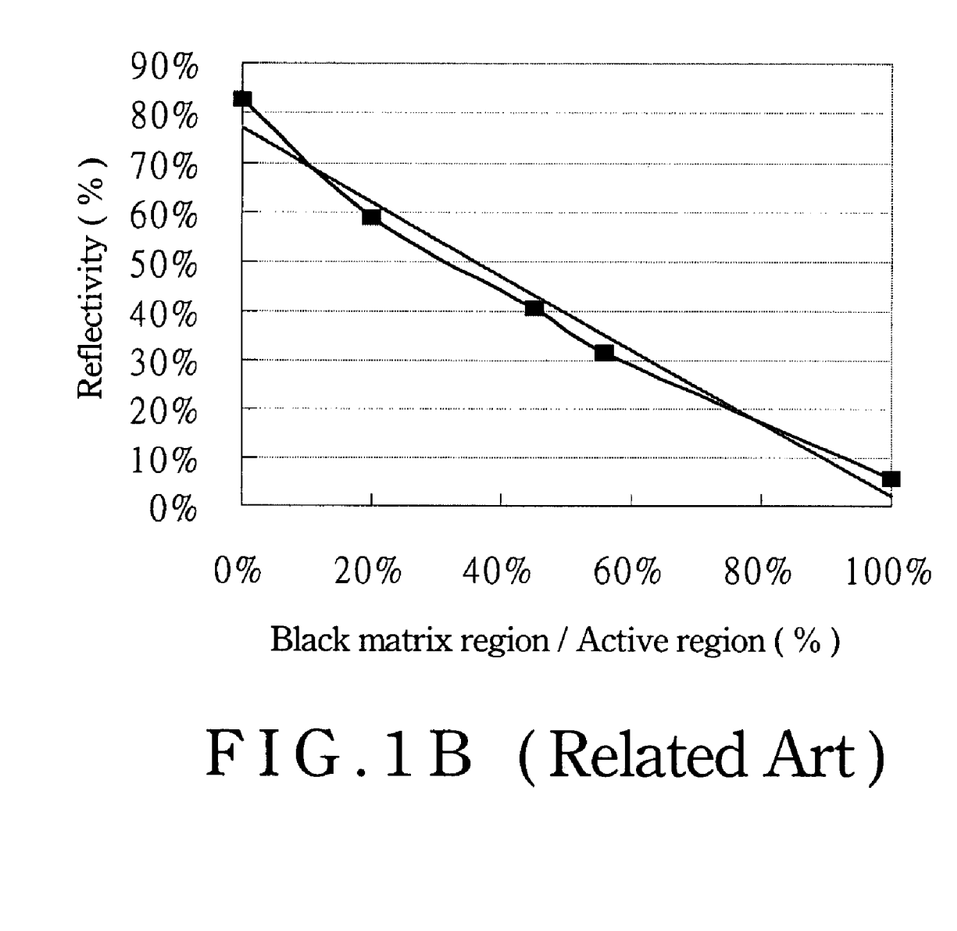
FIG. 1B shows that the relation between the reflectivity and the area ratio of the black matrix region to the active region.

FIG. 1B is a diagram showing the relation between the reflectivity and the area ratio of the black matrix region to the active region. The ordinate is the reflectivity of the organic electroluminescent display panel in the light of 550 nm. The abscissa is the area percent of the black matrix region 131 to the active region 13. FIG. 1B shows that the reflectivity decreases in proportion to the area percent of the black matrix region 131 to the active region 13. For example, when the black matrix region 131 covers the 20% of the active region 13, the reflectivity is about 60%. If the black matrix region 131 covers the active region 13 to reach to 68%, the reflectivity reduces to 25%.

Still refer to FIG. 1A, if the area ratio of the black matrix region 131 to the active region 13 is constant, an external anti-reflective film 16 is adhered to the outside of a light-emitting surface of the organic electroluminescent display panel 10 to reduce the reflectivity. However, the thickness of the organic electroluminescent display panel 10 is increased and the light transmission of the opening region 132 is reduced, so the brightness is reduced.

SUMMARY OF THE INVENTION

The object of the present invention is to provide an organic electroluminescent display panel and its fabricating method, which can form an anti-reflective layer between a substrate and a organic light emitting diode in the organic electroluminescent display panel to increase contrast ratio.

According to the present invention, the fabricating method of the organic electroluminescent display panel includes the steps of: forming an anti-reflective layer on the substrate; forming a light-shielding layer on the anti-reflective layer; defining the light-shielding layer as a first region and a second region; removing at least part of the light-shielding layer from the first region so as to expose the anti-reflective layer; forming a transistor on the light-shielding layer in the second region; and forming an organic light emitting diode on the anti-reflective layer in the first region.

The organic electroluminescent display panel fabricated by the above-mentioned method is described as follows. The anti-reflective layer is disposed on the substrate. The light-shielding layer covers on the anti-reflective layer, and has an opening region to expose at least part of the anti-reflective layer. The thin film transistor is disposed on the light-shielding layer. The organic light emitting diode is connected with the thin film transistor, and disposed on the anti-reflective layer exposed by the opening region. According to the present invention, it is unnecessary to adhere an anti-reflective film outside the organic electroluminescent display panel, but can form the anti-reflective layer inside the organic electroluminescent display panel by a simplified process. Thus, the organic electroluminescent display panel increases contrast ratio, but reduces the thickness without the influence of the brightness.

BRIEF DESCRIPTION OF THE DRAWINGS

The present invention will now be specified with reference to its preferred embodiment illustrated in the drawings, in which.

DESCRIPTION OF THE PREFERRED EMBODIMENT

Figure 2:
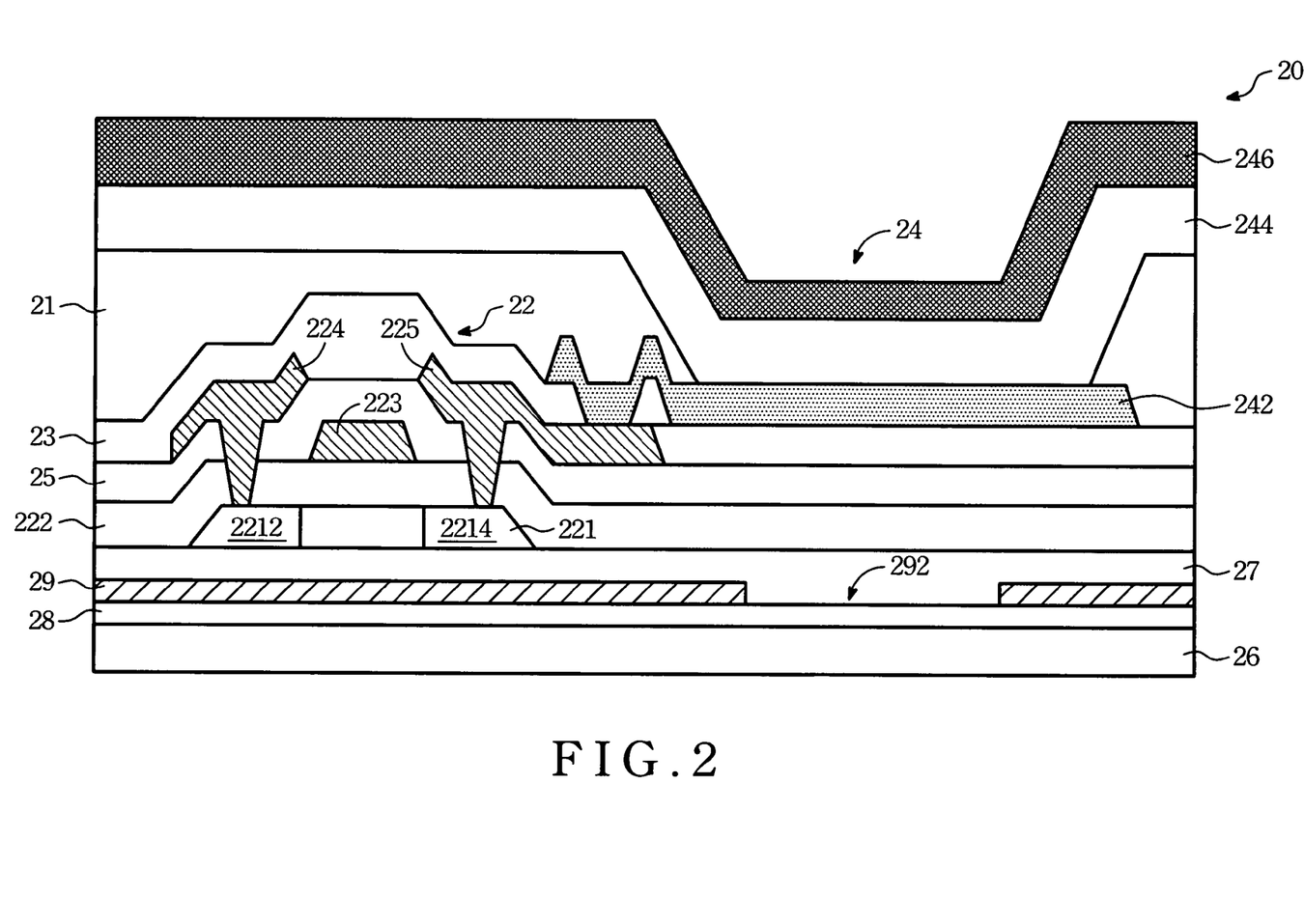
FIG. 2 is an organic electroluminescent display panel according to the present invention.

FIG. 2 is a sectional view of an organic electroluminescent display panel of the present invention. Each pixel of the organic electroluminescent display panel 20 includes a thin film transistor 22 and an organic light emitting diode 24, which are disposed on a substrate 26. Between the thin film transistor 22 and the substrate 26 have an anti-reflective layer 28 and a light-shielding layer 29. But there lacks the light-shielding layer 29 between the organic light emitting diode 24 and the substrate 26. The anti-reflective layer 28 is possible to form directly on the surface of the substrate 26. The light-shielding layer 29 covers on the anti-reflective layer 28, and has an aperture 292 to expose at least part of the anti-reflective layer 28. The organic light emitting diode 24 is disposed on the anti-reflective layer 28 exposed by the aperture 292. The thin film transistor 22 is disposed on the light-shielding layer 29 to drive the organic light emitting diode 24.

The anti-reflective layer 28 includes at least one metal compound layer, for example, the metal oxide, metal nitride, metal sulfide or the combinations of these compounds. The metal compound includes the metallic elements, such as Cr, Mo, Cu, Zn, In, Ti, Al or Ag etc. The light-shielding layer 29 can be a metal layer made of Cr, Mo, Cu, Zn, In, Ti, Al or Ag etc., or a black photoresist. Preferably, the anti-reflective layer 28 and the light-shielding layer 29 are made of the metals belonging to the same group in the periodic table of chemical elements. Usually, a flat layer 27 is disposed on the anti-reflective layer 28 and the light-shielding layer 29 to provide a flat base for the thin film transistor 22 or the organic light emitting layer 24. Note that the flat layer 27 is not required essentially according to the present invention.

The thin film transistor 22 has a semiconductor layer 221, a gate insulating layer 222, a gate electrode 223, a source electrode 224 and a drain electrode 225. The semiconductor layer 221 can be made of amorphous silicon or ploy-silicon. There are two contacting areas 2212, 2214 for the source electrode 224 and the drain electrode 225 to be heavily doped with p-type or n-type dopant, which is selected according to the types of the thin film transistor. The gate insulating layer 222, which is usually a oxide layer, is sandwiched between the semiconductor layer 221 and the gate electrode 223. An inner layer dielectric (ILD) 25 is sandwiched between the gate electrode 223, the source electrode 224 and the drain electrode 225. A passivation layer 23 is made of an insulating materials, such as silicon oxide or silicon nitride, and is disposed on the source electrode 224 and the drain electrode 225. The passivation layer 23 has a through hole to make the drain electrode 225 contact with one transparent electrode 242 so as to drive the organic light emitting diode 24.

Besides the transparent electrode 242, the organic light emitting diode 24 includes an organic emissive layer 244 and a reflective electrode 246. In this embodiment, a spacer layer 21 is formed on the passivation layer 23 and at least part of the transparent electrode 242 to separate one organic light emitting diode 24 from others. The spacer layer 21 also has an aperture (not numbered) corresponding to the aperture 292 of the anti-reflective layer 29. There is disposed the organic emissive layer 244, the reflective electrode 246, an electron injecting/transporting layer (not shown) or a hole injecting/transporting layer (not shown) in the aperture of the spacer layer 21.

FIGS. 3A-3E show the fabricating method of the organic electroluminescent display panel. First, the anti-reflective layer 28 is formed on the substrate 26. Next the light-shielding layer 29 is formed on the anti-reflective layer 28 and is defined as a first region 294 and a second region 296. Subsequently, The light-shielding layer 29 is removed from the first region 294 to expose the anti-reflective layer 28. In the second region 296, the thin film transistor 22 is fabricated on the light-shielding layer 29. And then, in the first region 294, the organic light emitting diode 24 is formed on the anti-reflective layer 28. The result structure is the organic electroluminescent display panel 20 shown as FIG. 2.

Figure 3A:
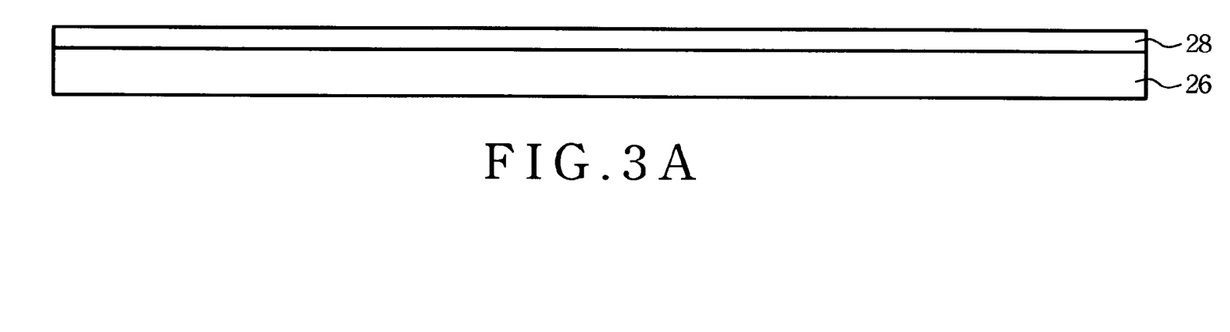
FIGS. 3A-3E show the fabricating process of the organic electroluminescent display panel according to the present invention.
Figure 3B:
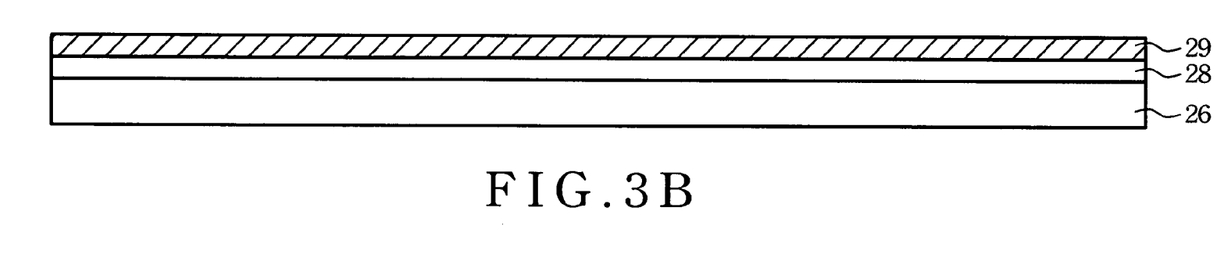
Figure 3C:
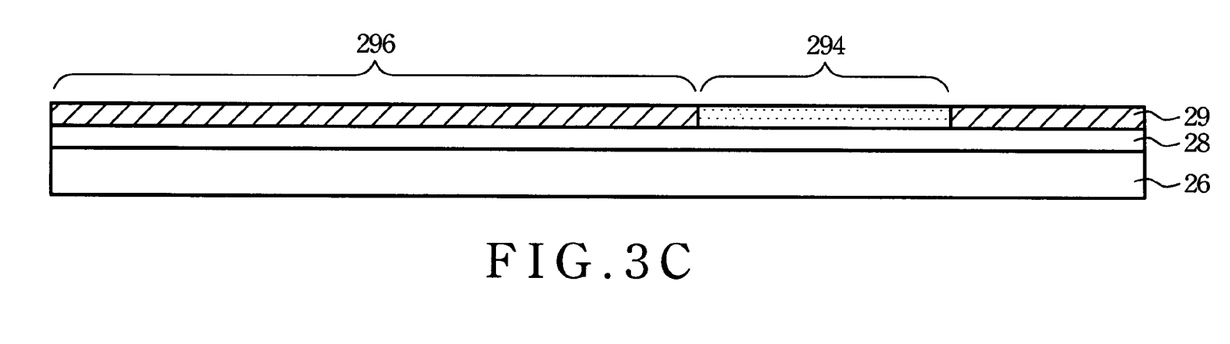
Figure 3D:
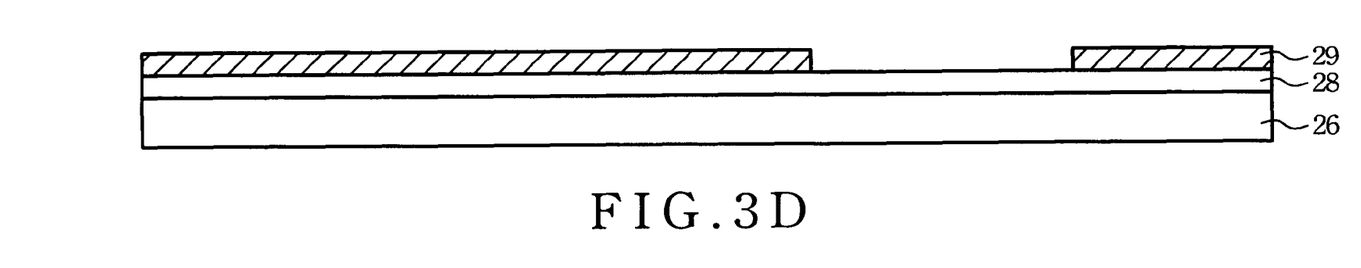
Figure 3E:
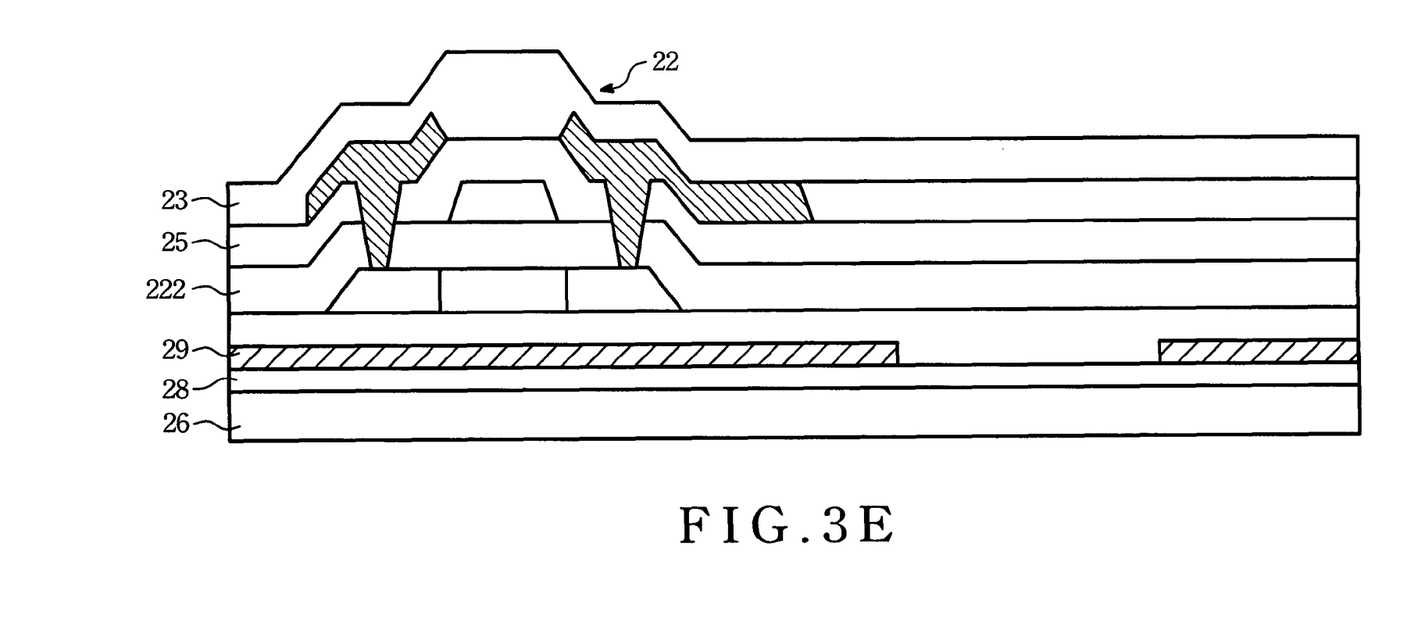

As shown in FIG. 3A, the anti-reflective layer 28 can be entirely formed on the substrate 26. As shown in FIG. 3B, a metallic material or a black photoresist can be deposited on the anti-reflective layer 28 to form the light-shielding layer 29. FIGS. 3C-3D show a patterning process of the light-shielding layer 29. A photomask (not shown) is provided for the light-shielding layer 29 to define it as the first region 294 and the second region 296. The anti-reflective layer 28 is exposed by etching the light-shielding layer 29 in the first region 294. It is worth observing that, if the etching velocity of the light-shielding layer 29 is larger than that of the anti-reflective layer 28, then the preferable etching efficiency and result are obtained. As shown in FIG. 3E, the gate insulating layer 222, the inner layer dielectric 25 and the passivation layer 23 are allowed to cover their lower structure entirely.

The way of etching control includes selecting a suitable etchant to control the etching velocity, or to control the etching time. Since the light-shielding layer 29 is a metal, and the anti-reflective layer 28 is a metal oxide, their etching is controlled by the suitable etchant which has the strong power to corrode metals, but the weak power to corrode metal oxides. In respect of other metals or metal oxides, different etchants can be chosen. When the light-shielding layer 29 and the anti-reflective layer 28 both include metals belonging to the same group in the periodic table of the chemical elements, the suitable etchants may be found more easily. Accordingly, the etching of the light-shielding layer 29 is controlled to be faster than that of the anti-reflective layer 28. In order to prevent the anti-reflective layer 28 from damage, the etching time can be controlled as follows. When the light-shielding layer 29 is removed completely from the first region 294, the etching can be stopped. By the way, the suitable etchants can help to reduce the etching time.

Figure 4A:
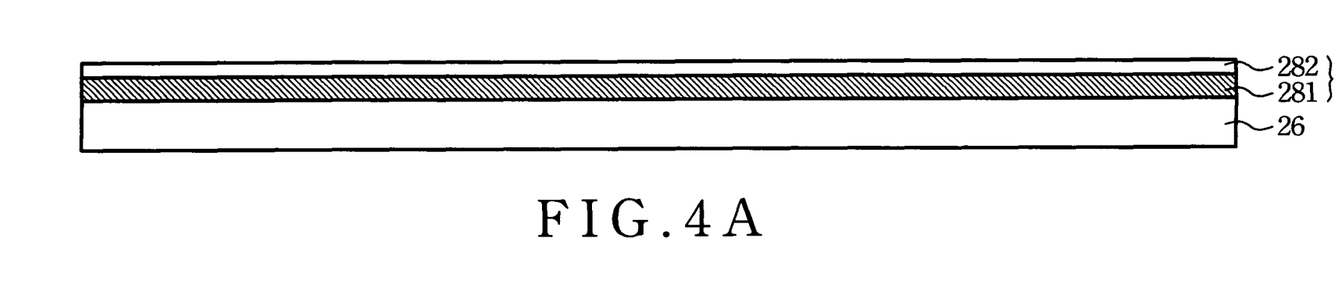
FIGS. 4A-4C show the fabricating process of the anti-reflective layer with a plurality of sub-layers.
Figure 4B:
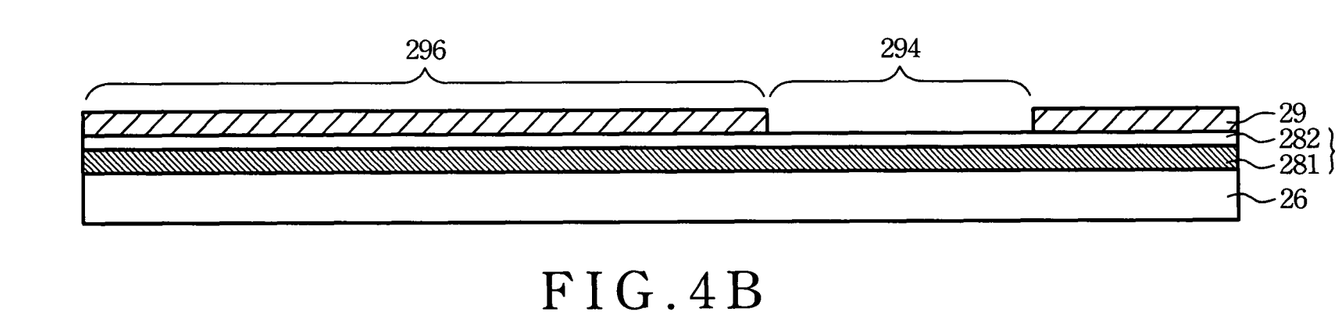
Figure 4C:
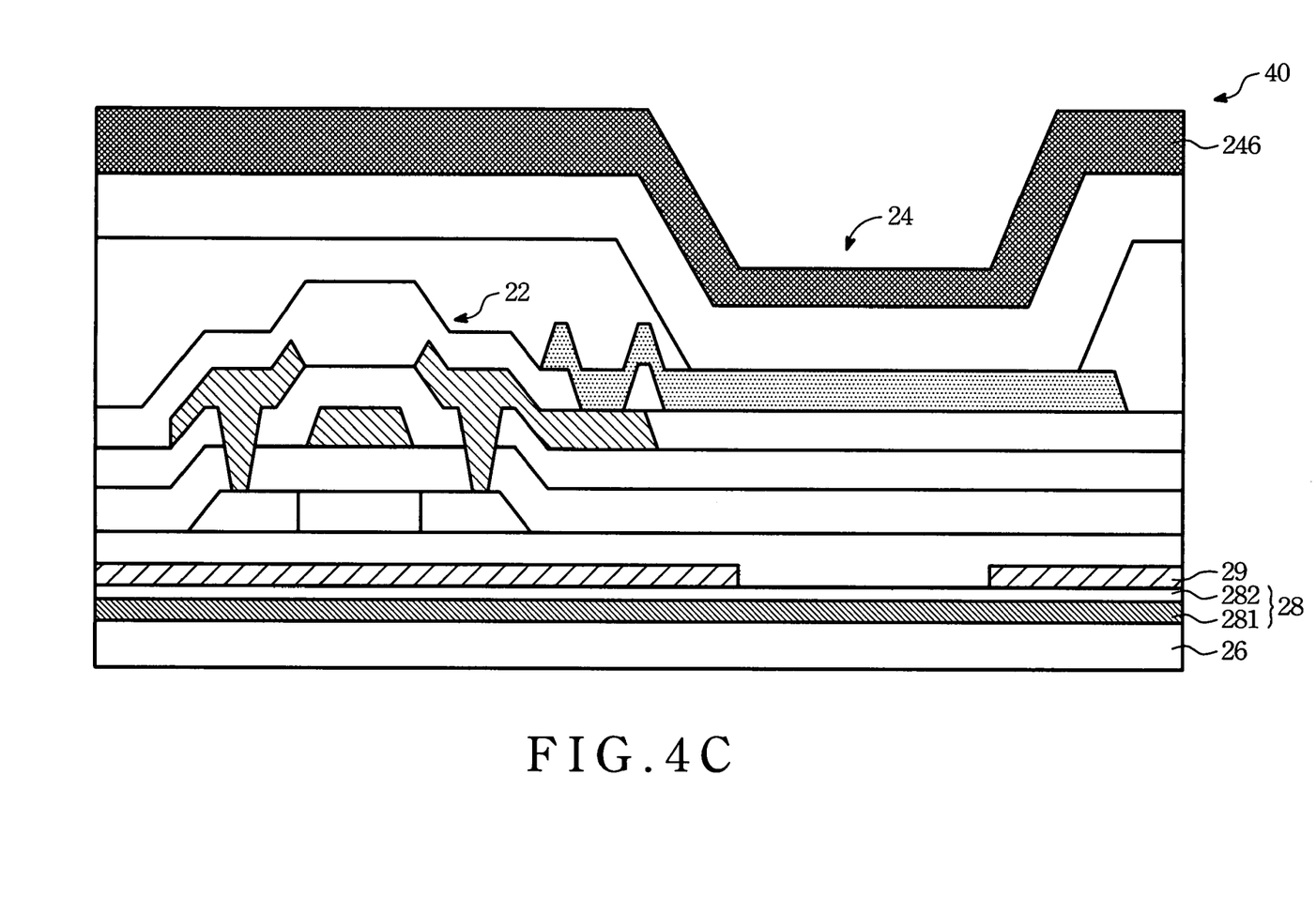

Refer to FIGS. 4A-4C, the steps of forming anti-reflective layer 28 further include forming a metal oxide layer 281 on the substrate 26, and then forming a metal nitride layer 282 on the metal oxide layer 281. Preferably, the thickness of the metal oxide layer 281 is larger than that of the metal nitride layer 282. As shown in FIG. 4B, in the first region 294, the light-shielding layer 29 is etched until exposing the metal nitride layer 282. In the organic electroluminescent display panel 40 shown in FIG. 4C, the ant-reflective layer 28 includes a plurality of metal compound layers, which include respectively different non-metallic elements combining with the same metallic element, or different metallic elements combining with the same non-metallic elements. The metallic elements include Cr, Mo, Cu, Zn, In, Ti, Al or Ag etc. The non-metallic elements include N, O or S etc.

In above-mentioned embodiments, the compounds, which are respectively required in the first region 294 and the second region 296, are formed by the same one process. These metal compound layers are disposed in the first region 294, and exposed by controlling the etching velocity of the black matrix. The result structure is the anti-reflective layer 28, which is able be reduce the reflectivity but increase the contrast ratio of the whole display panel. Compare with the related art, the present invention uses etching velocity control and only one photomast to form the anti-reflective layer 28 with one or a plurality of sub-layers in the first region 294. The anti-reflective layer 28 has a thickness that is odd multiples of ¼ wavelength in the range of visible light, so as to reduce the reflection of the environmental light but to increase the contrast ratio efficiently.

Continued from the preceding paragraph, the anti-reflective layer 28 includes a plurality of sub-layers, such as metal oxide layer and the metal nitride layer. Their total thickness is less than about 3000 nm to avoid affecting the light transmission. Regarding the organic electroluminescent display panel 20 or 40, they prefer odd multiples of ¼ wavelength of visible light in a distance, which does not include the thickness of the reflective electrode 246 and the transparent substrate 26, between the reflective electrode 246 and the transparent substrate 26.

Figure 5:
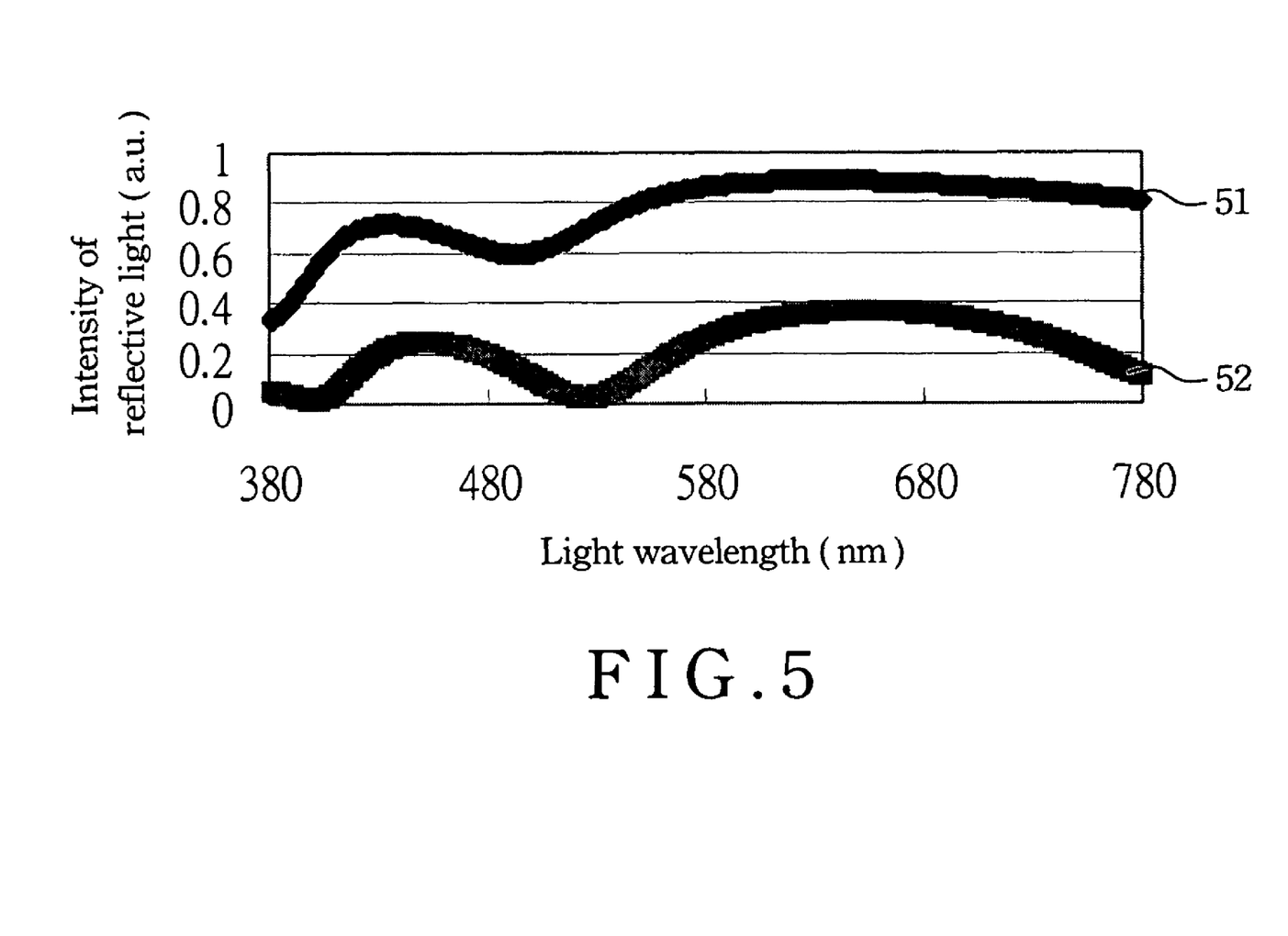
FIG. 5 is a diagram which shows the intensity of the reflective light changes with the wavelength in range of visible light.

FIG. 5 illustrates that the intensity of the reflective light changes with the wavelength of the visible light. The abscissa is light wavelength (nm), and the ordinate is the intensity of the reflective light (a.u.). The curve 51 illustrates when a common organic electroluminescent display panel reflects the visible light, the intensity of the reflective light is changed substantially from 0.3 a.u. to 0.9 a.u. The curve 52 illustrates when the organic electroluminescent display panel of the present invention reflects the visible light, the intensity of the reflective light is changed substantially from 0 a.u. to 0.4 a.u. The light intensity 1.0 a.u. represents the total internal reflection occurs.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A method for fabricating an organic electroluminescent display panel on a substrate, comprising:
    forming an anti-reflective layer on the substrate;
    forming a light-shielding layer on the anti-reflective layer after forming the anti-reflective layer on the substrate, the light-shielding layer having a first region and a second region, wherein the anti-reflective layer and the light-shielding layer are made of the metals belonging to the same group in the periodic table of chemical elements;
    removing the light-shielding layer from the first region so as to expose at least part of the anti-reflective layer after forming the light-shielding layer on the anti-reflective layer;
    forming a transistor on the light-shielding layer in the second region; and forming an organic light emitting diode on the anti-reflective layer in the first region after removing the light-shielding layer from the first region.

2. The method of claim 1, wherein forming the anti-reflective layer includes forming the anti-reflective layer on the entire substrate.

3. The method of claim 1, wherein forming the light-shielding layer includes forming a metal layer on the anti-reflective layer.

4. A method for fabricating an organic electroluminescent display panel on a substrate, comprising:
    forming an anti-reflective layer on the substrate, wherein the step of forming the anti-reflective layer further includes
    forming a metal oxide layer on the substrate, and
    forming a metal nitride layer on the metal oxide layer;
    forming a light-shielding layer on the anti-reflective layer after forming the anti-reflective layer on the substrate, the light-shielding layer having a first region and a second region;
    removing the light-shielding layer from the first region so as to expose at least part of the anti-reflective layer after forming the light-shielding layer on the anti-reflective layer;
    forming a transistor on the light-shielding layer in the second region; and
    forming an organic light emitting diode on the anti-reflective layer in the first region after removing the light-shielding layer from the first region.

5. The method of claim 4, wherein forming the anti-reflective layer includes forming the anti-reflective layer on the entire substrate.

6. The method of claim 4, wherein the metal oxide layer has a thickness larger than that of the nitride layer.

7. The method of claim 6, wherein removing the light-shielding layer includes etching the light-shielding layer to expose the metal nitride layer.

8. The method of claim 4, wherein forming the light-shielding layer includes forming a metal layer on the anti-reflective layer.

9. A method for fabricating an organic electroluminescent display panel on a substrate, comprising:
    forming an anti-reflective layer on the substrate;
    forming a light-shielding layer on the anti-reflective layer after forming the anti-reflective layer on the substrate, the light-shielding layer having a first region and a second region, wherein the anti-reflective layer has a thickness that is odd multiples of ¼ wavelength in the range of visible light;
    removing the light-shielding layer from the first region so as to expose at least part of the anti-reflective layer after forming the light-shielding layer on the anti-reflective layer;
    forming a transistor on the light-shielding layer in the second region; and
    forming an organic light emitting diode on the anti-reflective layer in the first region after removing the light-shielding layer from the first region.

* * * * *